United States Patent [19]

Suhr et al.

[11] Patent Number: 4,980,197

[45] Date of Patent: Dec. 25, 1990

[54] METHOD OF PRODUCING METALLIC STRUCTURES ON INORGANIC NON-CONDUCTORS

[75] Inventors: Harald Suhr; Ernst Feurer, both of Tübingen; Christian Oehr, Reusten, all of Fed. Rep. of Germany

[73] Assignee: Schering Aktiengesellschaft, Berlin and Bergkamen, Fed. Rep. of Germany

[21] Appl. No.: 853,338

[22] Filed: Apr. 16, 1986

[30] Foreign Application Priority Data

Apr. 16, 1985 [DE] Fed. Rep. of Germany ....... 3514094

[51] Int. Cl.$^5$ .................... B05D 3/06; B05D 5/00
[52] U.S. Cl. ...................... 427/39; 427/259; 427/273
[58] Field of Search ............ 427/39, 38, 259, 273

[56] References Cited

U.S. PATENT DOCUMENTS

| | | | |
|---|---|---|---|
| 3,677,799 | 7/1972 | Hou | 427/38 |
| 3,776,762 | 12/1973 | Bernath | 427/38 |
| 3,935,334 | 1/1976 | Narui et al. | 427/259 |
| 3,978,249 | 8/1976 | Cook | 427/259 |
| 4,322,457 | 3/1982 | Baron et al. | 427/259 |
| 4,377,438 | 3/1983 | Moriya et al. | 427/38 |
| 4,401,687 | 8/1983 | Rosler et al. | 427/38 |
| 4,405,656 | 9/1983 | Shimizu et al. | 427/39 |
| 4,422,897 | 12/1983 | Horwitz | 427/38 |
| 4,452,828 | 6/1984 | Namba et al. | 427/38 |
| 4,468,413 | 8/1984 | Bachmann | 427/39 |
| 4,473,596 | 9/1984 | Beerwald et al. | 427/39 |
| 4,481,229 | 11/1984 | Suzuki et al. | 427/38 |
| 4,517,223 | 5/1985 | Ovshinsky et al. | 427/39 |
| 4,521,275 | 6/1985 | Purdes | 427/38 |
| 4,581,101 | 4/1986 | Senoue et al. | 427/38 |
| 4,613,400 | 9/1986 | Tam et al. | 427/38 |
| 4,643,912 | 2/1987 | Nakagawa et al. | 427/259 |

OTHER PUBLICATIONS

Coburn et al, "H$_2$-Promoted Plasma Polymerization of Saturated Fluorocarbons", IBM Technical Disclosure Bulletin, vol. 19, #4, Sep. 1976.

*Primary Examiner*—Norman Morgenstern
*Assistant Examiner*—Marianne L. Padgett
*Attorney, Agent, or Firm*—Michael J. Striker

[57] ABSTRACT

A method for manufacturing metallic structures on inorganic non-conductive substrates, in which desired structures to be produced on the upper faces of the substrates are covered with screen means and the objects are then subjected to the action of reactive halogen-containing gases in a glow-discharge zone. Then the screen means are removed from the objects and they are metallized by known physical methods.

7 Claims, No Drawings

METHOD OF PRODUCING METALLIC STRUCTURES ON INORGANIC NON-CONDUCTORS

BACKGROUND OF THE INVENTION

The present invention relates to a method of producing metallic structures on inorganic non-conductive substrates.

Electrically-conductive structures or paths are generated on the substrates formed of ceramics, glass and the like. Usually such electrically-conductive metallic structures are manufactured in copper-plating or nickel-plating baths which are not very efficient.

SUMMARY OF THE INVENTION

It is an object of the present invention to provide an improved method of producing metallic structures on inorganic non-conductive upper surfaces of the substrates by physical methods which means without the application of aqueous etching and activation solutions.

A specific feature of the invention resides in that the structures to be obtained can be applied onto the substrate faces in a positive image. This can be handled by some other methods such as known methods in which the portions of the upper surfaces which must have a metallic coating are not covered and the substrate is also provided with a negative mask.

The objects of this invention are attained by a method of manufacturing metallic structures on inorganic non-conductive objects, which comprises the following steps:

(a) producing desired structures by applying to upper surfaces of the objects masks, lacquers or other screen means;

(b) treating the objects in a glow-discharge zone under the action of reactive halogen-containing gases;

(c) removing masks, lacquers or other screen means from the objects after said treating step has been completed;

(d) metallizing the objects by known physical methods; and (e) immersing the objects after said metallizing step into water or aqueous solutions of complex-forming agents, acids, alkalines or other materials which dissolve a result of metal halide-composition, for producing desired structures.

New ways for manufacturing printing circuit switches, particularly fine conductive circuits or multilayer circuits in electronics as well as structures and ornaments for decorative purposes are offered due to the proposed method.

The halogen-containing gases may be selected from the group consisting of boron trichloride, silicon tetrachloride, boron trifluoride and carbon tetrachloride.

The metallizing step may be carried out by vapor-depositing.

The metallizing step may be carried out by cathode disintegration.

The metallizing step may be carried out by plasma-metal depositing.

The structures obtained in said metallizing step may be reinforced in chemical baths for metallic deposition.

The objects may be immersed directly into a chemical bath for metallic deposition after said physical metallizing.

DETAILED DESCRIPTION OF THE PREFERRED EMBODIMENTS

The method of forming metallic structures on inorganic non-conductive surfaces according to the invention includes the following steps:

(1) Covering substrates of inorganic non-conductive material with screening masks, photolacquers or screen-printing lacquers in a positive method;

(2) Inserting the substrates into a glow-discharge zone under the action of reactive halogen-containing gases;

(3) Removal of the screening masks or coating lacquers;

(4) Metallizing of the substrates by conventional methods such as vapor-depositing; cathode disintegration, sputtering, plasma metallizing; and (5) "Development" of desired structures by the immersion of the substrates into aqueous or water solutions of metal-complex image builders or inorganic and/or organic compositions.

During the treatment of halogen-containing gases in plasma reactive halogen compositions appear on the non-covered surfaces of the substrates. In a surprising manner these compositions form during the final physical metal coating soluble metal halogens which upon a simple immersion process, can be solved so that the metallizing remains only on those places which were coated during the plasma treatment.

Reactive halogen compositions which are formed during the plasma treatment are remarkably stable. They are not removed for example by means of applying vacuum during the final vapor-depositing, and after a day-long deposing are fully effective so that a reliable operation during the manufacture of the structures according to the method of the invention is ensured.

The structures produced by the method of this invention can be easily reinforced by any known methods, preferably by a chemical copper-plating or chemical nickel-plating in baths for a autocatalytic metal deposition.

All conventional inorganic non-conductors can be used as the substrates on which metallic structures are to be produced. Such non-conductors as aluminum oxide ceramics, silicon oxide ceramics and glass are particularly suitable as well as metals with oxide coatings, for example aluminum.

The most suitable halogen-containing gases are boron trichloride, silicon tetrachloride, boron trifluoride, carbon tetrachloroxide.

The following examples illustrate the invention in greater detail:

EXAMPLE I

Manufacturing metallic structures on aluminum oxide ceramic by vapor-depositing with gold.

A desired conductive path image is deposited on ceramic plates of the size $50 \times 50 \times 2$ mm by means of a screen-printing lacquer or in accordance with other conventional method.

The plates are exposed to plasma-effect in a plasma reactor under the following conditions:

| | |
|---|---|
| Electrode temperature | 150° C. |
| Frequency | 13.56 MHz |
| Current density | 1.6 Watt/cm$^2$ |
| Pressure in Reactor | 0.5 KPa |
| Reaction gas | Boron trichloride |

| -continued | |
|---|---|
| Carrier gas | Argon |
| Operation time in Plasma | 90 Minutes |

After the completion of the plasma action ceramic plates are removed from the reactor and the screen-printing lacquer is removed from the plates by immersion of the latter into suitable organic solutions.

Plates are now subjected to a vacuum vapor-deposition with gold in a commercially available apparatus. At those places, which were not previously coated with lacquer and were also processed in plasma, gold will be converted into a water soluble composition. After the vaporization the plates are immersed into water whereby the gold composition is dissolved and desired structures remain on the outer surfaces of the plates as a gold film.

EXAMPLE 2

Manufacturing of metallic structures on silicon oxide ceramic by vapor-deposition with copper.

Plates of silicon oxide ceramic of the size 80×40×3 mm are coated with masks of desired structures and are subjected to plasma action under the conditions similar to those of Example I.

Then the plates are removed from the plasma reactor and masks are removed from the plates.

By the cathode vaporization the outer surfaces of the plates are coated with copper in the known manner. Then the plates are inserted into the 5% solution of ammonia in water. The copper layer at the places which were previously subjected to plasma is removed. The structures preset by the masks remain on the plates.

If desired the copper layer can be thickened in a chemical copper bath; no additional activation, for example by immersion into noble metal-containing solutions is required.

The same results can be obtained when plates are covered with silver in place of copper. Silver can be removed from some places by the immersion of the plates into the ammonia solution as a complex composition which was not covered during the plasma action.

It will be understood that each of the elements described above, or two or more together, may also find a useful application in other types of methods of producing metallic structures on inorganic non-conductors differing from the types described above.

While the invention has been illustrated and described as embodied in a method of producing metallic structures on inorganic non-conduction, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A method of manufacturing conductive metallic structures on inorganic non-conductive objects, which comprises the following steps:
    (a) preparing conductive structures by applying to upper surfaces of the objects masks, lacquers or other screen means in the position where the conductive structure is to be formed;
    (b) treating the objects with said masks, lacquers or other screen means thereon in a glow-discharge zone under the action of reactive halogen-containing gases;
    (c) removing said masks, lacquers or other screen means from the objects after said treating step has been completed;
    (d) metalizing the objects by known physical methods; and
    (e) immersing the objects after said metallizing step into water or aqueous solutions of complex-forming agents, acids, alkalines or material which dissolve resulting metal halide-compositions, to develop said conductive structures.

2. The method as defined in claim 1, wherein said halogen-containing gases are selected from the group consisting of boron trichloride, silicon tetrachloride, boron trifluoride and tetrachlorocarbon.

3. The method as defined in claim 1, wherein said metallizing step is carried out by vapor-depositing.

4. The method as defined in claim 1, wherein said metallizing step is carried out by cathode disintegration.

5. The method as defined in claim 1, wherein said metallizing step is carried out by plasma-metal depositing.

6. The method as defined in claim 1, wherein the structures obtained in said metallizing step are reinforced in chemical baths for metallic deposition.

7. The method as defined in claim 6, wherein said objects are immersed directly into a chemical bath for metallic deposition after said physical metallizing step.

* * * * *